United States Patent
Ishiguro et al.

(10) Patent No.: US 7,465,172 B2
(45) Date of Patent: Dec. 16, 2008

(54) ELECTRIC CONNECTION BOX

(75) Inventors: Masaaki Ishiguro, Kakegawa (JP); Kazue Nishihara, Kakegawe (JP); Masataka Amano, Kakegawa (JP)

(73) Assignee: Yazaki Corporation, Tokyo (JP)

( * ) Notice: Subject to any disclaimer, the term of this patent is extended or adjusted under 35 U.S.C. 154(b) by 129 days.

(21) Appl. No.: 11/408,991

(22) Filed: Apr. 24, 2006

(65) Prior Publication Data
US 2006/0246752 A1 Nov. 2, 2006

(30) Foreign Application Priority Data
Apr. 28, 2005 (JP) .............. P2005-132201

(51) Int. Cl.
*H01R 12/00* (2006.01)
(52) U.S. Cl. .............. 439/76.2; 174/50
(58) Field of Classification Search .............. 439/76.2, 439/724, 680, 49, 488, 489, 910
See application file for complete search history.

(56) References Cited

U.S. PATENT DOCUMENTS

| 5,502,620 | A | * | 3/1996 | Funck et al. .............. 361/753 |
| 5,888,088 | A | * | 3/1999 | Kobayashi et al. .......... 439/404 |
| 6,471,553 | B2 | * | 10/2002 | Kasai .................. 439/724 |
| 6,494,723 | B2 | * | 12/2002 | Yamane et al. ............. 439/76.2 |
| 6,557,913 | B1 | * | 5/2003 | Kunst .................. 292/340 |
| 6,821,159 | B2 | * | 11/2004 | Munger et al. ............. 439/680 |
| 6,870,096 | B2 | * | 3/2005 | Suzuki et al. .............. 174/50 |
| 6,870,097 | B2 | * | 3/2005 | Oda ..................... 174/50 |
| 6,919,509 | B2 | * | 7/2005 | Oda ..................... 174/59 |
| 6,923,660 | B2 | * | 8/2005 | Takeuchi ................ 439/76.2 |
| 6,971,888 | B2 | * | 12/2005 | Takeuchi et al. .......... 439/76.2 |
| 7,108,519 | B2 | * | 9/2006 | Tomikawa et al. ......... 439/76.2 |
| 2004/0257830 | A1 | * | 12/2004 | Okabe et al. ............. 362/555 |
| 2006/0211300 | A1 | * | 9/2006 | Kubota et al. ............ 439/535 |

FOREIGN PATENT DOCUMENTS

JP 2005-6498 A 1/2005

* cited by examiner

*Primary Examiner*—Renee Luebke
*Assistant Examiner*—Larisa Tsukerman
(74) *Attorney, Agent, or Firm*—Sughrue Mion, PLLC

(57) ABSTRACT

A window is formed in a common use cover for receiving one or a plurality of wiring boards therein, the inside and outside of the cover communicating with each other through the window. A convex portion for enabling the kind of the wiring board to be distinguished is formed on each of the wiring boards, and when the wiring boards are properly received within the cover, the convex portions project through the window to the exterior of the cover, or are disposed in facing relation to the window, and when the wire boards are improperly received in the cover, the convex portions are interfered with a wall of the cover. Each of the convex portions has an obverse/reverse distinguishing-function portion for enabling the obverse and reverse of the wiring board to be distinguished.

5 Claims, 6 Drawing Sheets

US 7,465,172 B2

ELECTRIC CONNECTION BOX

BACKGROUND OF THE INVENTION

1. Field of the Invention

This invention relates to an electric connection box in which one or a plurality of wiring boards are received, and for example, wire harnesses are connected/distributed to the electric connection box in a concentrated manner.

2. Related Art

An electric connection box for mounting on a vehicle comprises one or a plurality of wiring boards each having bus bars or wires installed thereon to thereby form a circuit of a desired installation pattern, and a cover which comprises an upper cover and a lower cover, and receives the wiring boards therein (see, for example, JP-A-2005-6498 Publication, Pages 3 to 4, FIG. 1). Recent electric connection boxes are constructed such that a common use cover is provided, and wiring boards are selected according to the specifications of a vehicle, and are received within the cover.

Once the wiring boards are received within the cover of the electric connection box, the wiring boards are covered with the cover, and therefore there is no way of knowing the installation pattern of the circuit of each wiring board received in the cover. Therefore, when a wrong wiring board is selected, there is encountered a problem that the off-specification product is delivered.

And besides, when each wiring board is to be inserted into the cover to be received therein, this operation must be carried out while confirming the direction or position of the wiring board in order to prevent an erroneous assemblage (erroneous mounting), thus posing a problem in this respect.

SUMMARY OF THE INVENTION

This invention has been made in view of the above circumstances, and an object of this invention is to provide an electric connection box which is capable of preventing the delivery of an off-specification product and an erroneous assemblage.

(1) The above object has been achieved by an electric connection box of the invention, characterized in that a window is formed in a common use cover for receiving one or a plurality of wiring boards therein, the inside and outside of the cover communicating with each other through the window; and a convex portion for enabling the kind of the wiring board to be distinguished is formed on each of the wiring boards, and when the wiring boards are properly received within the cover, the convex portions project through the window to the exterior of the cover, or are disposed in facing relation to the window; and when the wire boards are improperly received in the cover, the convex portions are interfered with a wall of the cover.

In the invention having the above features, by observing the convex portions of the wiring boards projecting through the window of the cover, the kind of each of the wiring boards within the cover can be confirmed. Also, when the convex portion of the wiring board is interfered with the wall of the cover during the insertion of the wiring board into the cover, it can be confirmed from this that the incorrect mounting has occurred.

(2) The electric connection box of the invention may be further characterized in that each of the convex portions has an obverse/reverse distinguishing-function portion for enabling the obverse and reverse of the wiring board to be distinguished.

In the invention having this feature, by observing the obverse/reverse distinguishing-function portion of the convex portion of each wiring board, it can be confirmed whether or not the obverse and reverse of the wiring boards, received within the cover, are accurately disposed.

In the invention, there is achieved an advantage that the delivery of an off-specification product and the erroneous assemblage can be prevented. In the invention of claim 2, there is achieved an advantage that the delivery of the off-specification product and the erroneous assemblage can be prevented more positively.

DETAILED DESCRIPTION OF THE PREFERRED EMBODIMENTS

Figure 1:
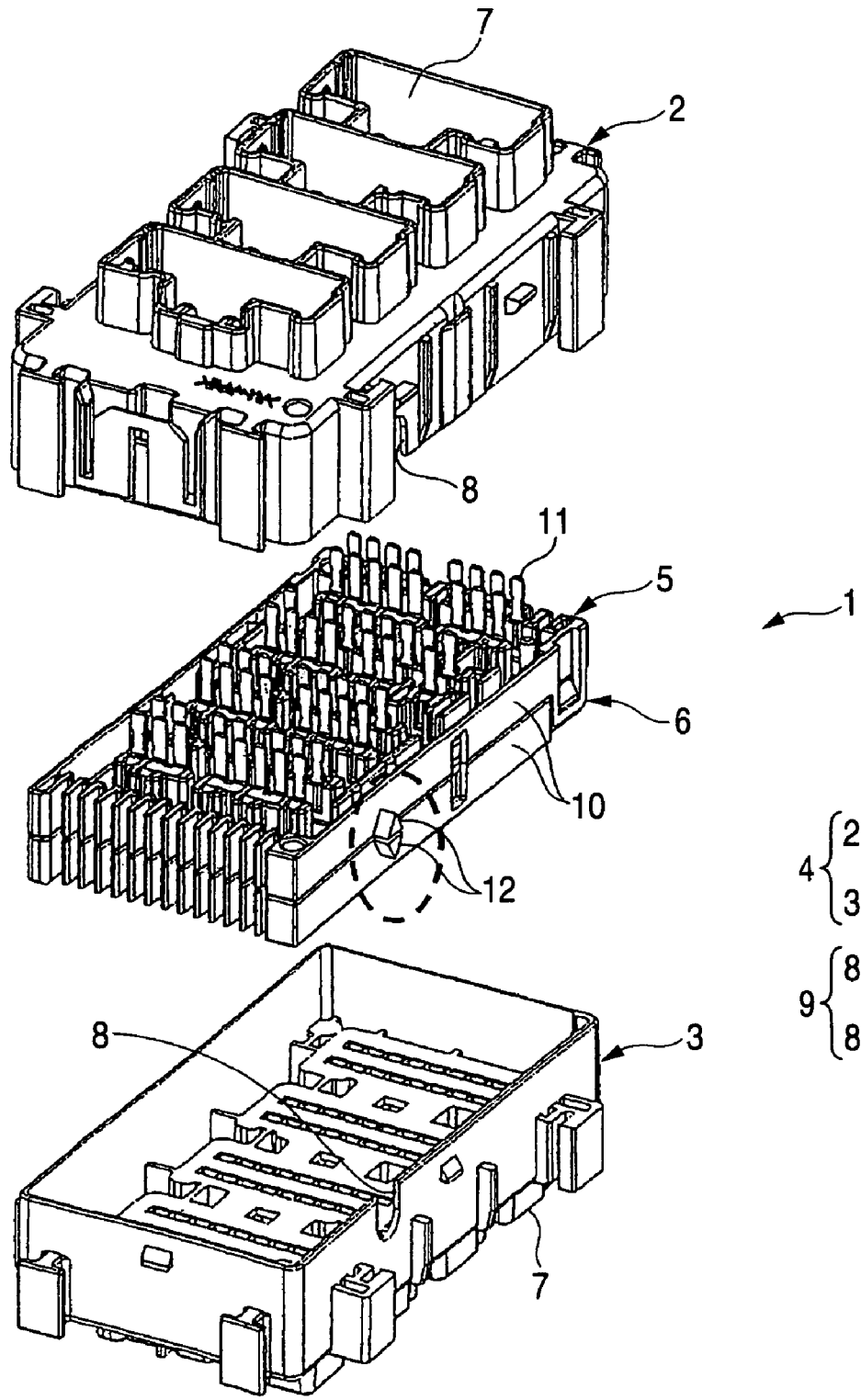
FIG. 1 is an exploded, perspective view showing one preferred embodiment of an electric connection box of the present invention (A circle of a broken line indicates an important portion.)
Figure 2:
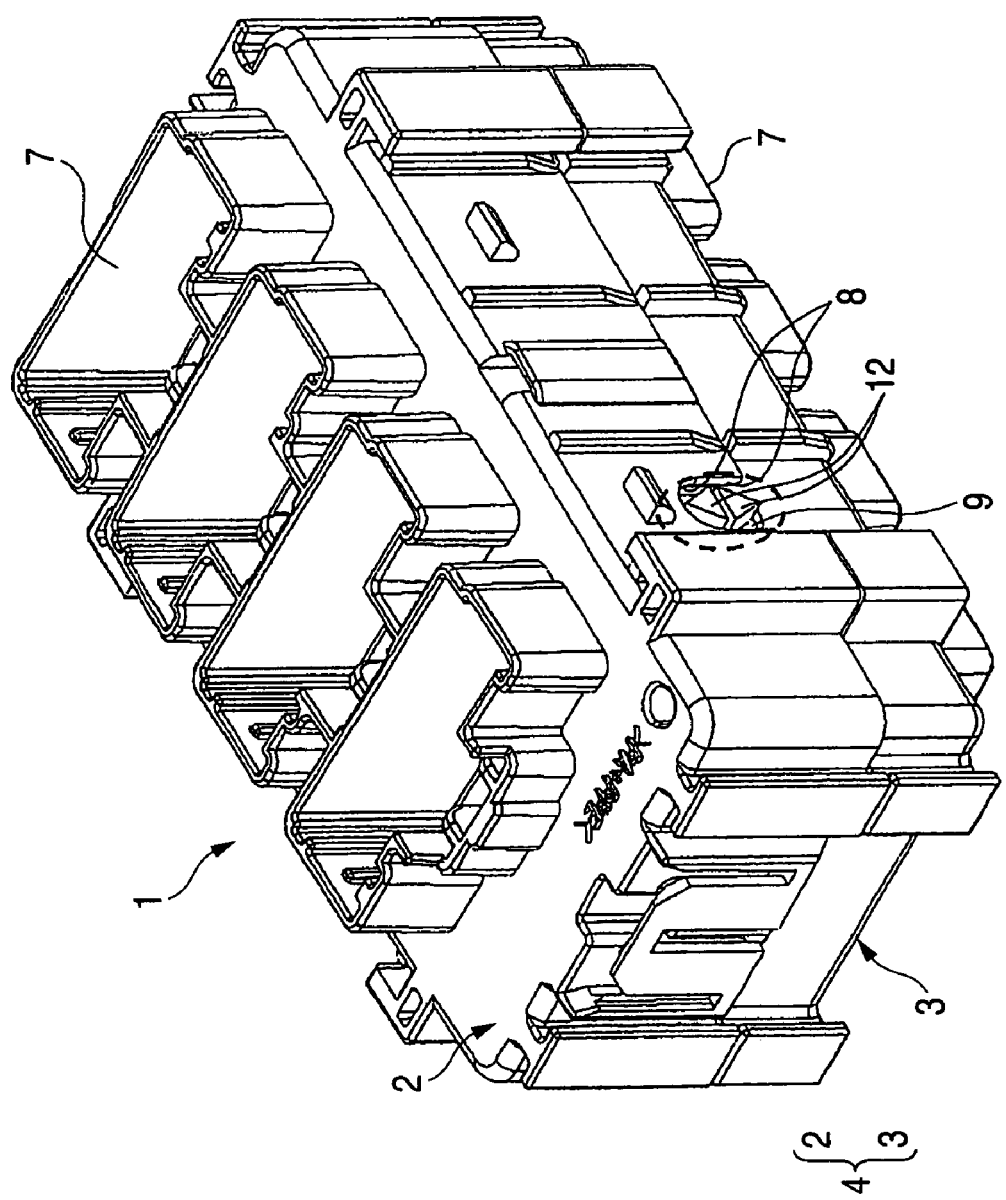
FIG. 2 is a perspective view of the electric connection box, showing the important portion (A circle of a broken line indicates the important portion.)
Figure 3:
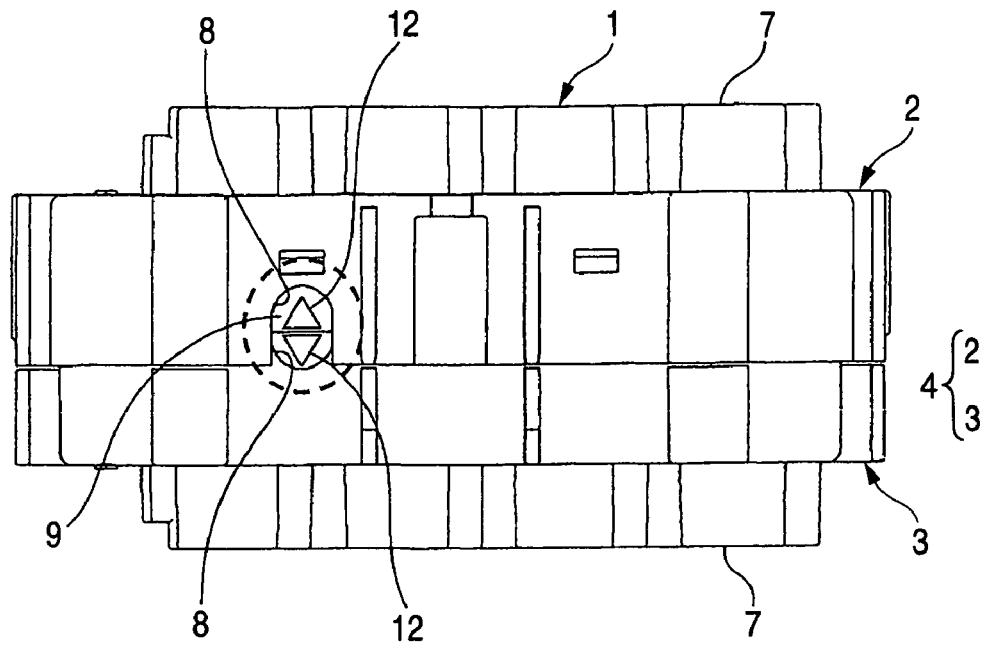
FIG. 3 is a side-elevational view of the electric connection box, showing the important portion (indicated by a circle of a broken line)
Figure 4:
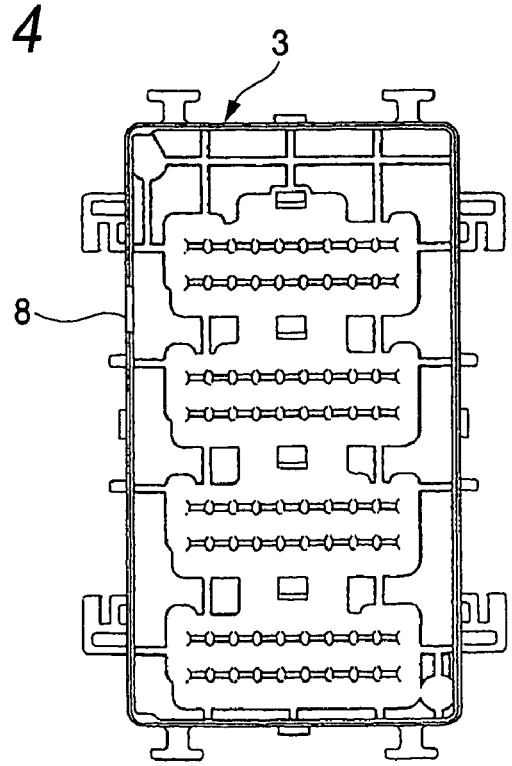
FIG. 4 is a plan view of a lower cover.
Figure 5:
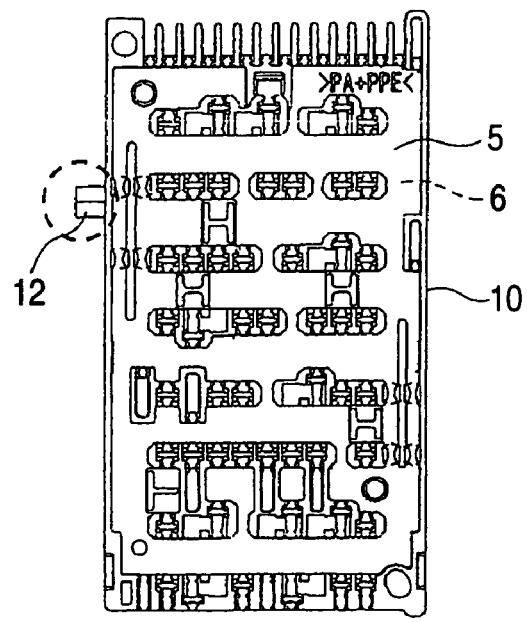
FIG. 5 is a plan view of wiring boards (A circle of a broken line indicates the important portion.)

The present invention will now be described with reference to the drawings. FIG. 1 is an exploded, perspective view showing one preferred embodiment of an electric connection box of the invention, FIG. 2 is a perspective view of the electric connection box, showing an important portion, FIG. 3 is a side-elevational view of the electric connection box, showing the important portion, FIG. 4 is a plan view of a lower cover, FIG. 5 is a plan view showing wiring boards, and FIGS. 6 to 9 are plan views of the lower cover and the wiring boards, showing various mounting patterns.

In FIG. 1, reference numeral 1 denotes the electric connection box of the invention. The electric connection box 1 is mounted within an engine room or an instrument panel of a vehicle, and for example wire harnesses are connected/distributed to the electric connection box in a concentrated manner. The electric connection box 1 comprises a cover 4 comprising an upper cover 2 and the lower cover 3, and the wiring boards 5 and 6 received within the cover 4. The electric connection box 1 of the invention is designed to prevent the delivery of an off-specification product and an erroneous assemblage (erroneous mounting). Each of the constituent members will be described below with reference to FIGS. 1 to 5.

The upper cover 2 is molded of an insulative synthetic resin. The upper cover 2 is molded into a box-like shape, and is open at its lower side (in FIG. 1). A plurality of connector housings 7 are formed in a juxtaposed manner on a top wall of the upper cover 2. A recess (slit) 8 of an inverted U-shape is formed in one side wall of the upper cover 2. This recess 8 overlaps a recess 8 (described later) in the lower cover 3 to form a window 9.

Like the upper cover 2, the lower cover 3 is molded of an insulative synthetic resin. The lower cover 3 is molded into a box-like shape, and is open at its upper side (in FIG. 1). A plurality of connector housings 7 are formed in a juxtaposed manner on a bottom wall of the lower cover 3. The recess 8 of a U-shape is formed in one side wall of the lower cover 3. The window 9, formed by the overlapped recesses 8, is formed such that the inside and outside of the cover 4 communicate with each other through this window 9 (The shape and position of the window 9 in the drawings are given merely as one example).

The upper cover 2 and the lower cover 3 have a known fitting structure. Description of this fitting structure is omitted here. The upper cover 2 and the lower cover 3 are used as a common use cover although not particularly limited to such a type. Namely, the upper and lower covers 2 and 3 can receive other wiring boards than the wiring boards 5 and 6.

Each of the wiring boards 5 and 6 includes a base board 10 of an insulating nature, and a circuit (not shown) of a desired installation pattern. The circuit (not shown) is formed, for example, by installing electrically-conductive bus bars (not shown) on the base board. In this embodiment, the wiring boards 5 and 6 are stacked together in an upward-downward direction (The number, etc., of the wiring boards are given merely as one example, and the number may be one or more than two.). The wiring board 5 is disposed in an upwardly-facing manner so as to face the upper cover 2, while the wiring board 6 is disposed in a downwardly-facing manner so as to face the lower cover 3. Projecting tabs 11, formed on each of the wiring boards 5 and 6, are so disposed as to be inserted into the corresponding connector housings 7. The tabs are connected to the corresponding circuits described above.

A bar-like convex portion 12 is formed on and projects straight laterally from one side surface of the base board 10 of each of the wiring board 5 and 6. The two convex portions 12 have such a length that when the wiring boards 5 and 6 are properly received within the cover 4, the convex portions 12 project through the window 9 to the exterior of the cover 4 (or may be disposed in facing relation to the window 9). When the wiring boards 5 and 6 are improperly received in the cover 4, the convex portions 12 are interfered with other walls (cover walls) of the upper and lower covers 2 and 3, so that the wiring boards 5 and 6 can not be received within the cover 4.

Each of the convex portions 12 has a kind distinguishing-function portion for enabling the kind of the wiring board 5, 6 to be distinguished (that is, for enabling the installation pattern of the circuit to be distinguished). Also, each convex portion 12 has an obverse/reverse distinguishing-function portion for enabling the obverse and reverse of the wiring board 5, 6 to be distinguished (that is, for enabling judgment of whether this wiring board is the upper cover (2)-side wiring board or the lower cover (3)-side wiring board. In this embodiment, the kind distinguishing-function portion and the obverse/reverse distinguishing-function portion are defined by the shape of the convex portion 12 itself.

Referring to a specific example, the convex portion 12 is formed into a triangular prism-shape, and by observing this triangular prism-shaped convex portion 12, the installation pattern of the circuit of the wiring board can be judged. Also, by observing the peak of the triangular prism-shaped convex portion 12, it can be confirmed from this whether or not the wiring board is reversed with respect to its obverse and reverse sides.

Figure 10:
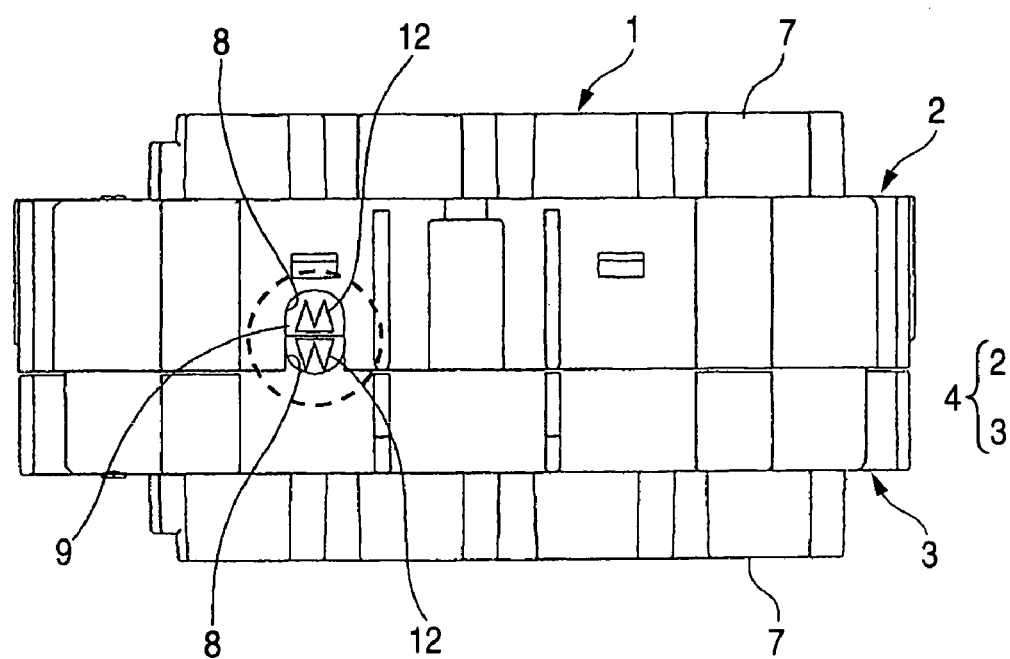
FIG. 10 is a side-elevational view of the electric connection box, showing another example of a shape of convex portions (A circle of a broken line indicates an important portion.).

The kind distinguishing-function portion and the obverse/reverse distinguishing-function portion of the convex portion 12 can be defined by a double triangular prism-shape as shown in FIG. 10. When the convex portion is formed into a cylindrical shape (although this is not particularly shown in the drawings), this convex portion has only the kind distinguishing-function portion (The convex portion is not limited to any of the above-mentioned shapes.).

Next, an assembling operation (mounting operation), based on the above construction, will be described with reference to FIGS. 1 to 5.

The electric connection box 1 is assembled by inserting the stacked wiring boards 5 and 6 into the lower cover 3 and then by fitting the upper cover 2 on the lower cover 3 to cover the wiring boards 5 and 6 received within the lower cover 3. Here, the position of the window 9 of the cover 4 coincides with the position of the convex portions 12 of the wiring boards 5 and 6, and therefore the wiring boards 5 and 6 are properly received within the cover 4.

Next, correct and incorrect mounting patterns will be described with reference to FIGS. 6 to 9.

Figure 6:
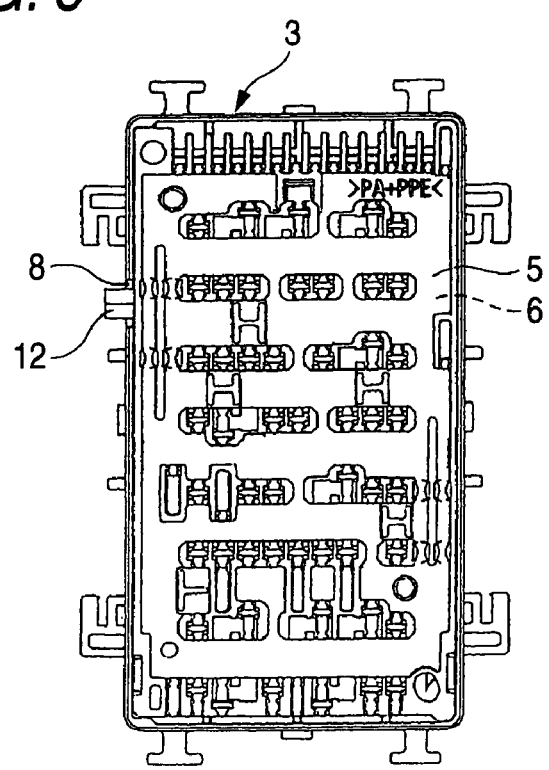
FIG. 6 is a plan view of the lower cover and the wiring boards, showing a mounting pattern (correct pattern)

In FIG. 6, the stacked wiring boards 5 and 6 are properly received within the lower cover 3. This can be appreciated since the position of the recess 8 of the lower cover 3 (the position of the window 9 of the cover 4) coincides with the position of the convex portions 12 of the wiring boards 5 and 6. On the other hand, in FIG. 7, the stacked wiring boards 5 and 6 are improperly received within the lower cover 3. This can be appreciated since the position of the convex portions 12 of the wiring boards 5 and 6 is different from the position of the convex portions 12 of the wiring boards 5 and 6 shown in FIG. 6. Namely, the stacked wiring boards 5 and 6 are reversed with respect to the obverse and reverse sides.

Figure 7:
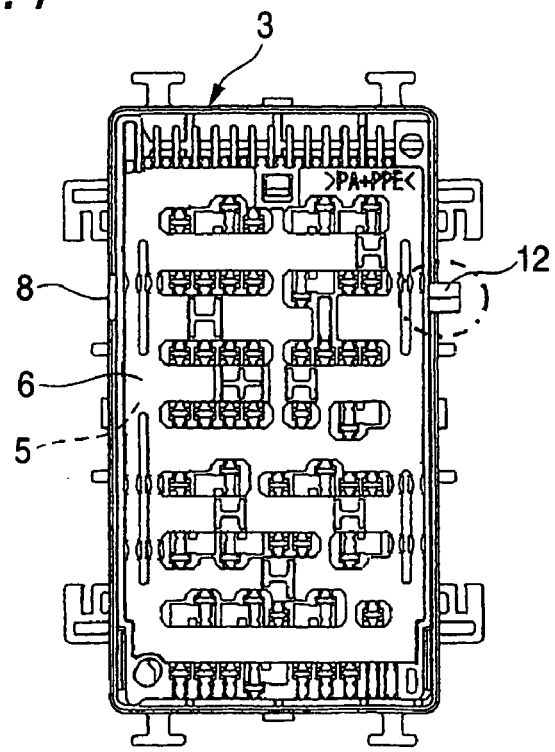
FIG. 7 is a plan view of the lower cover and the wiring boards, showing a mounting pattern (incorrect pattern 1) (A circle of a dot-and-dash line indicates the position of convex portions.)
Figure 8:
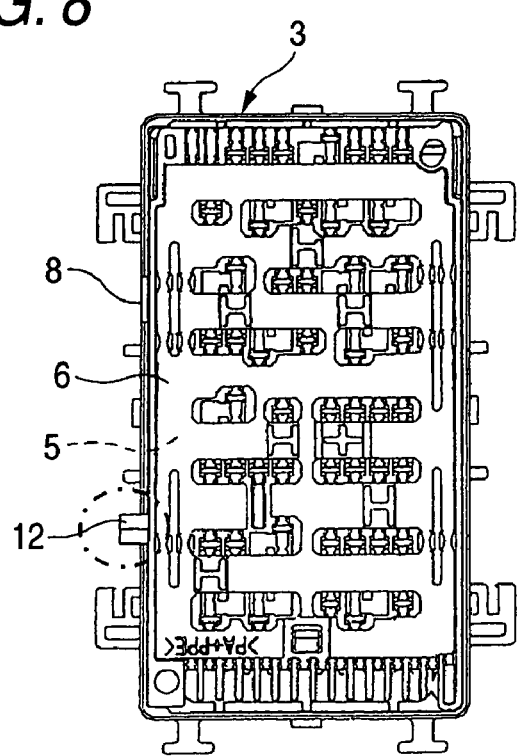
FIG. 8 is a plan view of the lower cover and the wiring boards, showing a mounting pattern (incorrect pattern 2) (A circle of a dot-and-dash line indicates the position of the convex portions.)
Figure 9:
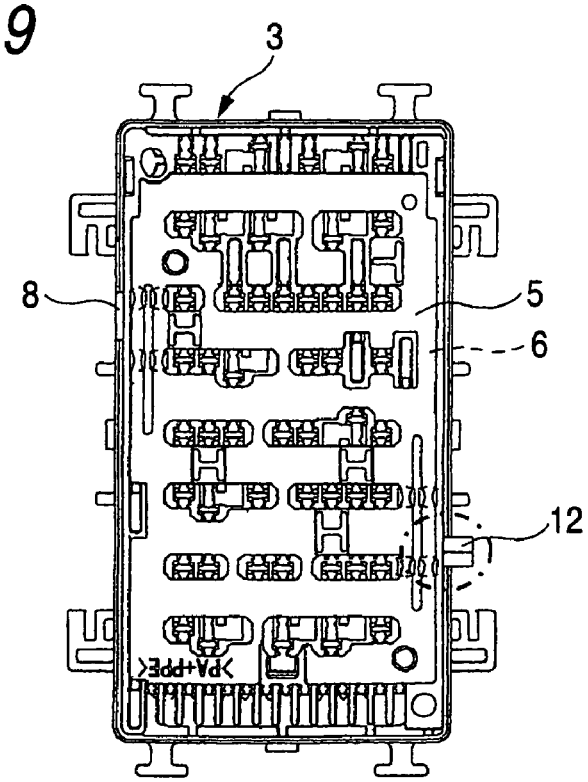
FIG. 9 is a plan view of the lower cover and the wiring boards, showing a mounting pattern (incorrect pattern 3) (A circle of a dot-and-dash line indicates the position of the convex portions.)

In FIG. 8, the stacked wiring boards 5 and 6 are turned through an angle of 180 degrees relative to the wiring boards 5 and 6 of FIG. 7 reversed with respect to the obverse and reverse sides. Therefore, the stacked wiring boards 5 and 6 are improperly received within the lower cover 3. In FIG. 9, the stacked wiring boards 5 and 6 are turned through an angle of 180 degrees relative to the wiring boards 5 and 6 of FIG. 6. Therefore, the stacked wiring boards 5 and 6 are improperly received within the lower cover 3.

As described above with reference to FIGS. 1 to 9, in the present invention, there is achieved an advantage that the delivery of the off-specification product and the erroneous assemblage can be prevented.

In the present invention, various modifications can be made without departing from the subject matter of the invention.

What is claimed is:

1. An electric connection box comprising:
    a common use cover having an upper cover open at a lower side thereof and a lower cover open at an upper side thereof, the common use cover for receiving at least one wiring board therein, said common use cover having a window formed therein to communicate between an inside and an outside of said common use cover when said upper cover and said lower cover are connected together; and a plurality of wiring boards, each wiring board including a protruding portion for enabling a user to distinguish the kind of said wiring board, wherein, when said wiring boards are properly received within said common use cover, said protruding portions project through said window, or are fitted to said window; and when said wire boards are improperly received in said common use cover, said protruding portions are interfered with a wall of said common use cover, whereby a receiving condition of said wiring boards are judged, and wherein the protruding portion of a first wiring board of the plurality of wiring boards points upward and wherein the protruding portion of a second wiring board of the plurality of wiring boards point downward.

2. An electric connection box according to claim 1, wherein said protruding portions have an obverse/reverse distinguishing-function portion for enabling a user to distinguish an obverse side and a reverse side of said wiring boards.

3. An electric connection box according to claim 1, wherein said upper cover and said lower cover are molded into a box-like shape, and a recess is formed in one side wall of said upper cover, and another recess is formed in one side wall of said lower cover, said recess in the upper cover overlaps the another recess in the lower cover to form said window, and said protruding portions project straight laterally from one side surface of said wiring board, and have such a length that when the wiring board is properly received within said common use cover, said protruding portions project through said window to exterior of said common use cover.

4. An electric connection box according to claim 1, wherein a kind distinguishing-function portion for enabling a user to determine an installation pattern of said wiring board and an obverse/reverse distinguishing-function portion for enabling a user to distinguish an obverse side and a reverse side of said wiring board, are defined by a shape of said protruding portions.

5. An electric connection box according to claim 1, wherein said protruding portions are formed into triangular prism-shapes.

* * * * *